(12) United States Patent
Launay

(10) Patent No.: US 8,439,273 B2
(45) Date of Patent: May 14, 2013

(54) CONTACTLESS ELECTRONIC TAG

(75) Inventor: François Launay, Vitre (FR)

(73) Assignee: Oberthur Technologies, Levallois Perret (FR)

( * ) Notice: Subject to any disclaimer, the term of this patent is extended or adjusted under 35 U.S.C. 154(b) by 84 days.

(21) Appl. No.: 13/186,406

(22) Filed: Jul. 19, 2011

(65) Prior Publication Data
US 2012/0018523 A1     Jan. 26, 2012

(30) Foreign Application Priority Data
Jul. 20, 2010     (FR) ..................... 10 55888

(51) Int. Cl.
*G06K 19/06*     (2006.01)
(52) U.S. Cl.
USPC .......................... 235/492; 235/487

(58) Field of Classification Search ............... 235/492, 235/487
See application file for complete search history.

(56) References Cited

U.S. PATENT DOCUMENTS
2009/0315320 A1   12/2009   Finn

FOREIGN PATENT DOCUMENTS
FR     2 890 212     3/2007
WO    WO 2006/064200    6/2006

*Primary Examiner* — Kristy A Haupt
(74) *Attorney, Agent, or Firm* — Cozen O'Connor

(57) ABSTRACT

The contactless electronic device (12) comprising a near-field communication antenna (18), a microcircuit (20) connected to the antenna (18) and a magnetic shielding layer (24) arranged so as to extend substantially facing the antenna (18). The antenna (18) and the microcircuit (20) are combined into a module (26) and the device (12) comprises a body (16) comprising and open cavity (30) on one of its faces in which are housed the module and the shielding layer in such a way that the shielding layer closes off the cavity.

14 Claims, 3 Drawing Sheets

CONTACTLESS ELECTRONIC TAG

RELATED APPLICATIONS

This application claims the priority of French application no. 10/55888 filed Jul. 20, 2010, the disclosure content of which is hereby incorporated by reference.

FIELD OF THE INVENTION

The present invention relates to the technical field of electronic tags of the contactless type. It applies more precisely but not exclusively to electronic tags intended to be affixed to the metal surface of an object.

BACKGROUND OF THE INVENTION

By electronic tag is meant an assembly comprising a substrate, a near-field communication circuit comprising an electronic chip and a near-field communication antenna, allowing contactless communication to be established with an external device for exchanging data. The antenna is generally connected to the electronic chip and serves not only as a means of contactless communication but also to produce the energy needed to feed the electronic chip.

In order to ensure optimal transmission of the data between the tag and the external device regardless of the metallic environment of the tag, the tag is provided with a magnetic shielding layer capable of protecting the near-field communication circuit.

This is particularly advantageous, particularly for a "contactless payment" application embedded in a mobile telephone, the mobile telephone including a battery and sometimes even a metal case which can greatly harm the quality of data transmission to an outside reader when the tag is affixed to the telephone.

A contactless tag designed for application in a metallic environment is already known in the state of the art, particularly from document WO2008/065278. In this document, the tag includes an intermediate layer made of a magnetically hyperconducting material, placed against a substrate bearing the antenna and the microcircuit. The assembly made up of the substrate, the antenna and the microcircuit is subsequently embedded in a cover made of plastic by lamination or casting.

The disadvantage of the tag thus obtained is that it remains relatively thick due to the presence, in addition to the substrate bearing the antenna and the microcircuit, of the intermediate layer and the cover. In addition, in this document, the dimensions of the tag are defined by the dimensions of the antenna which extends over a relatively large surface area.

There is at present a need for a customizable tag, of small thickness, of small dimensions and low manufacturing cost. In addition, this tag must be designed to operate in a metallic environment such as for example the vicinity of a mobile telephone.

SUMMARY OF THE INVENTION

One object of the invention is to provide a tag satisfying this need.

To this end, one aspect of the invention is directed to a contactless electronic device comprising a near-field communication antenna, a microcircuit connected to the antenna and a magnetic shielding layer arranged to extend substantially facing the antenna. The antenna and the microcircuit are combined into a module and the device includes a body having an open cavity on one of its faces in which are housed the module and the shielding layer such that the shielding layer closes off the cavity.

Due to the invention, the thickness of the tag is advantageously optimized. Indeed, the shielding layer is housed in the same cavity as the module and closes off this cavity. This double function of the shielding layer makes it possible to optimize the thickness of the tag. In addition, due to the fact that the antenna is incorporated into the module, the length and the width of the tag can be substantially reduced to the effective surface of the antenna. The manufacture of such a tag is in addition relatively simple since all that is needed is to form a cavity in a substrate layer and to incorporate the different functional elements such as the antenna, the microcircuit and the shielding layer.

A device according to an embodiment of the invention can additionally include one or another of the features in which:
  the cavity includes a deep central area for housing the module and a raised peripheral area surrounding the central area for housing the shielding layer;
  the cavity being provided with a peripheral wall and a bottom, the wall includes an upper step separating the central area and the peripheral area, to form an upper edge supporting the shielding layer;
  the cavity being provided with a peripheral wall and a bottom, the wall includes, in the central area, a lower step separating the first area housing the microcircuit from a second area for housing a module substrate bearing the microcircuit and the antenna, to form a lower edge supporting the module substrate;
  the module includes a substrate bearing the microcircuit and the antenna;
  the body includes an electrically conductive ring substantially surrounding en outside perimeter of the antenna and extending in a plane parallel to a plane containing the antenna, or in the same plane;
  the device is a tag of the contactless type.

Another aspect of the invention is directed to a substrate for a tag of the contactless type comprising a body in the general shape of a plate and a small detachable plate constituting the tag, characterized in that, the tag being one according to the invention, the cavity extends into the interior of the small plate.

A tag substrate according to an embodiment of the invention can also include the following features in which:
  the small detachable plate is delimited by a breakable line made in the substrate and designed to allow separation of the small plate from the substrate by manual pressure alone;
  the breakable line includes through perforations and/or blind perforations;
  the body including two small detachable plates constituting first and second tags arranged side by side and facing in each other.

Another aspect of the invention is directed to a manufacturing method for an electronic device including a near-field antenna and a microcircuit connected to the antenna and a shielding layer extending substantially facing the antenna, characterized in that a dimensioned cavity is formed to receive the module and the shielding layer, the cavity comprising a deep central area for housing the module and a peripheral area surrounding the deep central area for housing the shielding layer.

A method according to an embodiment of the invention can also include one or another of the features in which:
  the central area comprises a first central area provided with a bottom for housing the microcircuit and a second peripheral area raised with respect to the first central area delimiting a step with a bottom for housing a substrate of the module bearing the antenna and the microcircuit;

the cavity comprises three levels corresponding respectively to a first peripheral area for housing the shielding layer, to a second intermediate area for housing the subtitle of the module bearing the antenna and the microcircuit and a third central area housing the microcircuit.

BRIEF DESCRIPTION OF THE DRAWINGS

Other features and advantages of the invention will appear in the light of the description that follows, made with reference to the appended drawings in which.

DETAILED DESCRIPTION OF THE DRAWINGS

Figure 1:
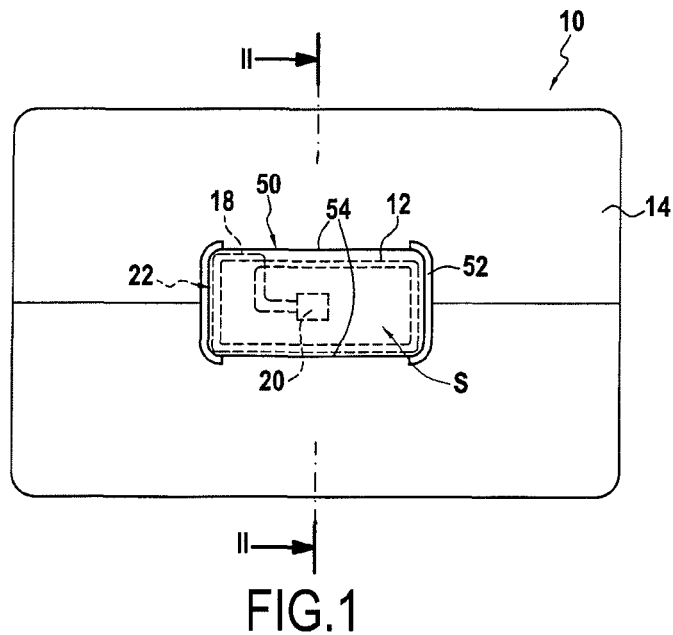
FIG. 1 shows a top view of a substrate for a contactless type tag according to a first embodiment of the invention.

Shown in FIG. 1 is an assembly comprising an electronic device according to a first embodiment of the invention and a substrate bearing the electronic device. The assembly is designated by the general reference number 10, the electronic device is designated by the reference number 12 and the substrate by the reference number 14.

In the example described, the device 12 is a contactless type electronic tag. For example, the tag 12 comprises a body 16 with a thickness substantially equal to 600 micrometers. The body 16 is for example made of a plastic such as PVC or even PC (polycarbonate), PE (polyethylene), etc. This body 16 is preferably made by laminating together layers of plastic. For example, the body 16 is made by lamination of at least two layers made of plastic, for example, and laminated together. In this first embodiment, the body 16 is formed in a single layer of plastic.

Figure 2:
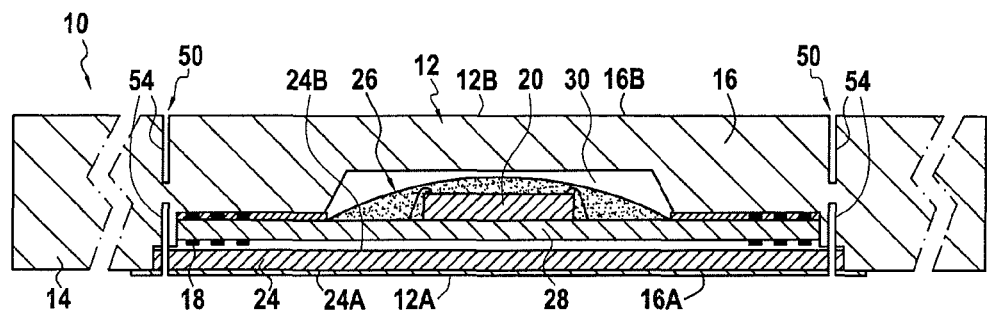
FIG. 2 shows a section view along line 2-2 of the substrate of FIG. 1.

The tag 12 comprises, as illustrated in FIG. 2, a near-field communication antenna 18 and a microcircuit 20 connected to the antenna 18 (shown dotted in FIG. 1). The microcircuit 20 and the antenna 18 together constitute near-field communication means capable of communicating with external equipment such as a specialized reader. For example, the near-field communication means 22 of the tag 12 and the reader are able to communicate in compliance with the ISO 14443 communication protocol.

The antenna 18 consists for example of a plurality of electrically conductive coils and delimits an effective surface S for receiving a magnetic field. By effective surface S is meant, for the purposes of the invention, the surface area of the antenna 18 which, when traversed by a magnetic field, produces an induced current circulating in the antenna 18. This effective surface S is in this example delimited by the outside perimeter of the antenna 18. In addition, in this example, the antenna 18 is made up of two parts 18A, 18B.

In addition, the tag 12 includes a magnetic shielding layer 24 arranged to extend at least partly facing the surface S of the antenna 18. Such a layer 24 makes it possible in particular to reduce the magnetic disturbances generated by a metallic environment situated in proximity to the tag 12. The layer 24 is made for example of an electrically insulating and magnetically permeable material such as ferrite for example. The thickness of the layer is comprised for example between 100 and 300 micrometers and its relative permeability is roughly 100.

Preferably, the layer 24 has dimensions slightly greater than the surface S of the antenna 18 and is arranged in the tag 12 so as to cover its entire surface S.

Figure 4A:
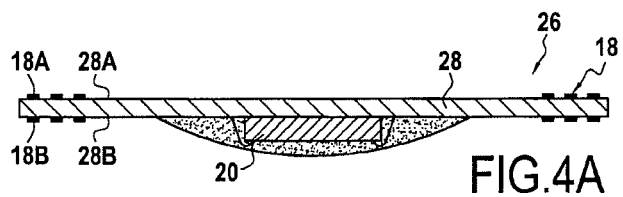
FIGS. 4 through 7 illustrate schematically the different manufacturing steps of the device of FIG. 1.
Figure 4B:
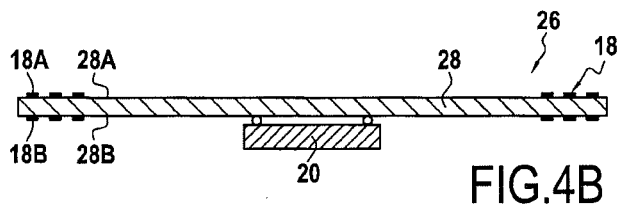

More particularly and in conformity with the invention, the antenna 18 and the microcircuit 20 are combined in a single module 26 illustrated in detail in FIG. 4A or FIG. 4B. Preferably, this module 26 comprises a substrate 28 bearing the microcircuit 20 and the antenna 18. For example, the substrate 28 is delimited by first 28A and second 28B opposite faces, one of the faces bearing the microcircuit 20 and at least part of the antenna 18, the antenna 18 possibly consisting of two parts 18A, 18B extending on each of the faces 28A, 28B of the substrate 28 as illustrated in FIG. 2.

In the example illustrated in FIG. 4A, the microcircuit 20 is assembled by means of wire contacts, the microcircuit 20 being encapsulated in a polymer resin shell 21. This process is called "wire bonding." In a variation illustrated by FIG. 4B, the microcircuit 20 is assembled on the substrate 28 by means of a chip transfer process, the microcircuit 20 being said in this case to be "flip-chip" mounted.

More precisely, the tag 12 comprises an open cavity 30 on one of the faces 16A, 16B of the body 16 of the tag 12. Inside this cavity 30 are housed the module 26 and the shielding layer 24 in such a way that the shielding layer 24 closes off the cavity 30.

Thus the module 26 is entirely incorporated into the body 16 of the tag 12 and can not be extracted without removing the shielding layer 24 which closes off this cavity 30 and hides the module 26 in the body 16 of the tag 12.

Preferably, the cavity 30 being delimited by a peripheral wall 32 and a bottom 34, the cavity 30 includes a central area for housing the module and a peripheral area 38 surrounding the central area 36 for housing the shielding layer 24.

As illustrated in FIG. 2, the peripheral region 38 is sized to completely receive the shielding layer 24.

In addition, the wall 32 preferably includes an upper step 40 separating the central area 36 and the peripheral area 38 to form an upper edge 41 supporting the shielding layer 24.

In the example described, the central area 36 is itself made of two distinct areas, a first central area 42 for housing the microcircuit 20 and a second peripheral area 44 for housing the substrate 28 of the module 26. The central area 36 preferably includes a lower step 46 for forming a lower edge 48 supporting the substrate 28 of the module 25 bearing the microcircuit 20 and the antenna 18. Thus, the lower step 46 delimits with the bottom 34 of the cavity 30 a deep area 42 for housing the microcircuit 20.

Preferably, as illustrated in FIGS. 1 and 2, the contactless type tag 12 forms a detachable plate of the contactless tag substrate 14. In the example described, the substrate 14 is made of a plastic identical to that constituting the body 16 of the tag 12, the tag 12 and the substrate 14 being drawn from the same stock. For example, the substrate 14 is made by lamination of at least two layers made of a plastic, for example, and laminated together.

In a preferred embodiment of the invention (illustrated in FIG. 1), the substrate 14 delimits outside dimensions compliant with a standard microcircuit card format, for example the ID-1 format of the ISO 7816 standard. Preferably, however, the card has a thickness less than the 800 micrometers compliant with the ISO 7816 standard. AS a variation, the thickness can be about 600 micrometers.

For example, the small plate constituting the tag 12 is delimited by a breakable line 50, provided in the substrate 14 and arranged to allow separation of the small plate 12 and the substrate 14 by manual pressure alone along this line 50. For example, the line 50 includes through perforations 52 and/or blind perforations 54. In the example illustrated, the small plate 12 has a substantially rectangular general shape and through perforations 52 are made along the short lateral edges and blind perforations 54 are made along the long lateral edges of the rectangle forming the small plate.

In the embodiment of the invention, the tag 12 has dimensions of about 15 mm×30 mm for example, possibly 30 mm×20 mm.

In the example illustrated and by preference, the peripheral area 38 of the cavity 30 extends at least through the entire small plate 12, for example extending to either side of the periphery of the small plate 12. Thus, the breakable line 50 extends partly on the shielding layer 24 and this line 50 includes at least one perforation running through the thickness of the shielding layer 24.

In addition, by preference, the shielding layer 24 includes a first face 24A to be oriented toward the outside of the cavity 30, a first adhesive coating to allow the detachable small plate to be transferred to a surface of an external piece of equipment by adhesion, is flush with the surface of the substrate. Preferably, this first adhesive coating is provided with a removable non-adhesive foil to facilitate the handling of the device and avoid the accumulation of dust and particles on the adhesive coating.

Further, the shielding layer 24 includes a second face 24B to be oriented toward the inside of the cavity 30. This face 24B includes for example a second adhesive coating such that the layer 24 can be transferred by adhesion into the cavity 30.

The small plate, once detached, constitutes a contactless electronic tag 12 having a reading face 12B from which data can be exchanged between the near-field communication means and an external reader and a shielding face 12A capable of limiting all the interference that can be generated by an object onto which the tag is affixed.

Figure 10:
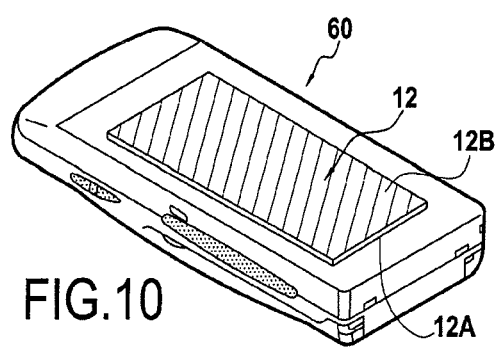
FIG. 10 shows a mobile telephone bearing a contactless electronic tag forming a small detachable plate of the device of FIG. 1.

For example, the small detachable plate or the contactless type electronic tag incorporates an electronic payment function and is intended to be transferred by adhesion onto a mobile telephone terminal 60, as illustrated in FIG. 10. In particular, it can be seen in this figure that the tag 12 is stuck to the back of this telephone.

Figure 8:
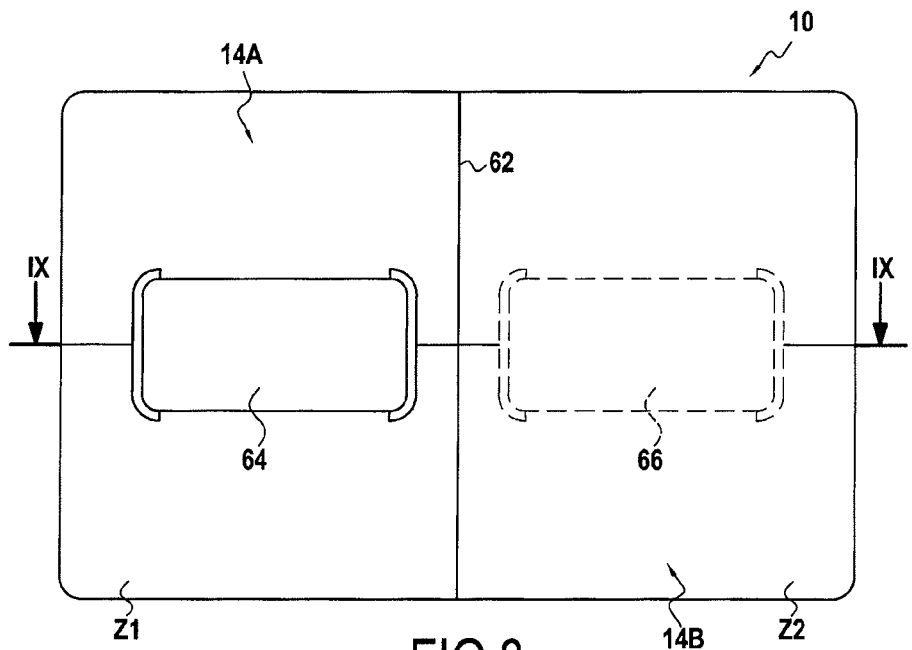
FIG. 8 shows a top view of a substrate for a contactless type tag bearing two contactless type tags.
Figure 9:
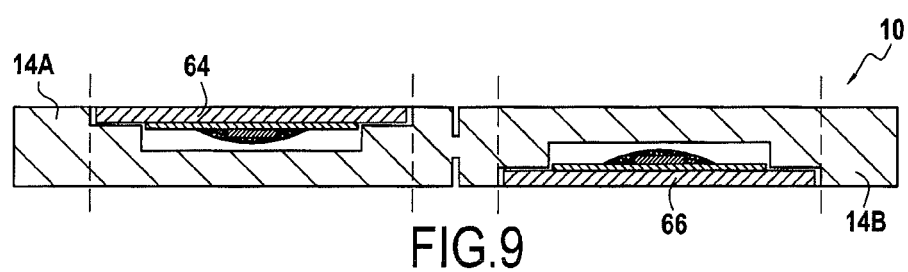
FIG. 9 shows a section view along line IX-IX of the substrate of FIG. 8.

Also shown in FIGS. 8 and 9 is another embodiment of the tag substrate in which two contactless type tags can be placed.

The substrate 14 comprises a card body with at least the first 64 and second 66 electronic tags. The tags respectively comprise the first and second transponder assemblies capable of being activated by the application of a magnetic field.

Preferably, these electronic tags are set side by side along a longitudinal direction of the card body and facing each other. In this case, the substrate is provided with a weakening line 62 separating two areas Z1, Z2 each bearing one of the electronic tags 64, 66. This weakening line comprises for example two blind perforations with a "U" shape in profile made in both faces of the card substrate opposite one another. The tags are also arranged facing one another and cavities are formed on each of the opposite faces in such a way that the tags are arranged with opposite orientations.

This face-to-face arrangement of the tags also has the advantage of preventing the application of a magnetic field to one of the faces of the substrate from causing the activation of both transponder assemblies, particularly in the case of a customization.

Figure 3:
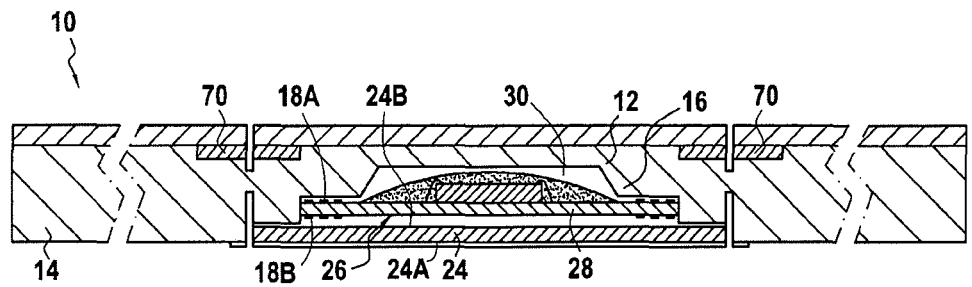
FIG. 3 shows a section view along line 2-2 of the device of FIG. 1, according to a second embodiment of the substrate of FIG. 1.

A second embodiment of the device according to the invention is shown in FIG. 3. In this figure, equivalent elements are designated by identical reference numbers.

In this second embodiment, the tag 12 also includes an electrically conductive ring 70, constituting a means of amplifying the gain of the antenna 18, which extends around an outside perimeter of the antenna 18 in the same plane as the latter or, as illustrated in FIG. 3, in a plane parallel to the plane containing at least part of the antenna 18A or 18B.

Thus, the ring 70 consists for example of a deposit of electrically conductive ink on one face of one of the layers constituting the body 16 of the tag 12. Preferably, in this case, the body 16 of the tag 12 consists of at least two layers of plastic. In addition, in this case, the ring 70 is preferably set straddling the breakable line 50 delimiting the outside perimeter of the small plate so that the width of the ring is maximized by extending it as close as possible to the outside perimeter of the small detachable plate.

Figure 5:
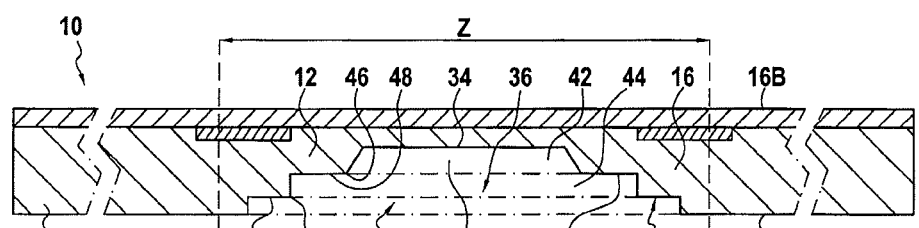

The principal steps of a manufacturing method for the assembly 10 according to the second embodiment of the invention will now be described with reference to FIGS. 5 through 7.

First, the card body constituting the substrate of the tag is made, for example by laminating together a plurality of layers. For example, at least two layers are laminated so as to obtain a card body with a thickness less than or qual to 600 micrometers. In addition, as illustrated in FIG. 5, a ring 70 of electrically conductive ink is preferably deposited on one of the faces of one of the layers so that this ring can surround the module once the latter is housed in the tag.

Then the method comprises a step of machining a cavity in the card body 20. A location Z for the small detachable plate 12 is preferably defined beforehand, and the cavity 30 is machined in that location Z.

Such a cavity is generally obtained by machining, typically by milling or spot facing in three continuously executed operations:
  a large spot facing operation to form the peripheral area 38,
  a medium spot facing operation to form the intermediate area 44,
  a small spot facing operation to form the deeper central area 42.

Thus the cavity is made in a single spot facing operation, the spot facing tool moving to form the different steps.

Figure 6:
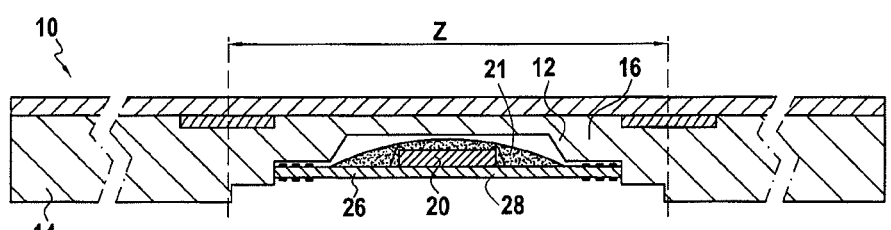

Then the method comprises a step of housing the module 26 in the cavity 30 (FIG. 5) in such a way that the substrate 28 of the module 26 rests on the inner peripheral edge 48 surrounding the deep area 42, and a step of housing the magnetic shielding layer 24 within the cavity 30 as illustrated in FIG. 6: preferably, this shielding layer 24 is transferred by adhesion to the inside of the cavity 30. In addition, the shielding layer 24 includes, on the face opposite to that glued to the bottom of the cavity, the adhesive coating provided with a removable anti-adhesive foil.

Figure 7:
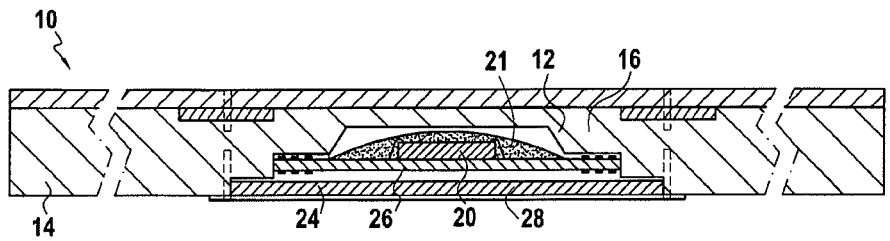

Finally, the method comprises a step of pre-cutting of the small plate along the boundaries defined by the location Z to form the small plate detachable from the substrate as illustrated in FIG. 7. In the preferred embodiment of the invention, this pre-cutting step consists of forming a breakable line 50 allowing separation of the small plate from the body by manual pressure alone.

Thanks to the invention, due to the fact that the shielding layer 24 is incorporated into a substrate and that the transponder assembly is also incorporated into the same cavity as the shielding layer, the thickness of the substrate can be relatively reduced.

The invention claimed is:

1. A contactless electronic device (12) comprising a near-field communication antenna (18), a microcircuit (20) connected to the antenna (18) and a magnetic shielding layer (24) arranged so as to extend substantially facing the antenna (18), wherein the antenna (18) and the microcircuit (20) are combined into a module (26), and wherein the device (12) comprises a body (16) comprising an open cavity (30) on one of its faces in which are housed the module (26) and the shielding layer (24) so that the shielding layer (24) closes off the cavity (30).

2. The device (12) according to claim 1, wherein the cavity (30) comprises a deep central area (36) for housing the module (26) and a raised peripheral area (38) surrounding the central area (36) for housing the shielding layer (24).

3. The device (12) according to claim 2, wherein the cavity (30) is provided with a peripheral wall (32) and a bottom (34), the wall (32) comprises an upper step (38) separating the central area (36) and the peripheral area (38) to form an upper edge (41) supporting the shielding layer (24).

4. The device (12) according to claim 2, wherein the cavity (30) being provided with a peripheral wall (32) and a bottom (34), the wall comprises, in the central area, a lower step (46), separating a first area (42) for housing the microcircuit (20) and a second area (44) for housing a module (26) substrate (28) bearing the microcircuit (20) and the antenna (18), to form a lower edge (48) supporting the module (26) substrate (28).

5. The device (12) according to claim 1, wherein the module comprises a substrate bearing the microcircuit (20) and the antenna (18).

6. The device (12) according to claim 1, wherein the body includes an electrically conductive ring (70) substantially surrounding an outside perimeter of the antenna (18) and extending within a plane parallel to a plane containing the antenna (18) or in the same plane.

7. The device (12) according to claim 1, being a contactless type tag.

8. A substrate (14) for a contactless type tag (12), comprising a body in the general shape of a plate and a small detachable plate (12) constituting the tag, wherein, the tag (12) being a device according to claim 1, the cavity extends into the small plate.

9. The substrate (12) according to claim 8, wherein the small detachable plate (12) is delimited by a breakable line (50) provided in the substrate (14) and designed to allow separation of the small wafer (12) from the substrate (14) by manual pressure alone.

10. The substrate (14) according to claim 9, wherein the breakable line (50) comprises through perforations (52) and/or blind perforations (54).

11. The substrate (14) according to claim 8, the body of the substrate (12) including two small detachable plates (12A, 12B) constituting the first and second tags arranged side by side along a longitudinal direction of the substrate (14), and facing each other.

12. A method for manufacturing an electronic device (12) comprising a near-field communication antenna (18) and a microcircuit (20) connected to the antenna (18), the antenna (18) and the microcircuit (20) being combined in a module (26), and a shielding layer (24) extending substantially facing the antenna (18), wherein a cavity (30) is made, sized to receive the module (26) and the shielding layer (24), the cavity (30) comprising a deep central area for housing the module (26) and a peripheral area surrounding the central area for housing the shielding layer (24).

13. The method according to claim 12, wherein the central area (36) comprises a first central area (42) provided with a bottom (34) for housing the microcircuit (20) and a second peripheral area (44), raised with respect to the first central area (42), delimiting a step (46) with the bottom (34) for housing a substrate (28) of the module (26) bearing the antenna (18) and the microcircuit (20).

14. The method according to claim 12, wherein the cavity (30) comprises three levels corresponding respectively to a first peripheral area (38) for housing the shielding layer (24), to a second intermediate area (44) for housing a module (26) substrate (28) bearing the antenna (18) and the microcircuit (20) and to a third central area (46) for housing the microcircuit (20).

* * * * *